(12) United States Patent
Nishikawa et al.

(10) Patent No.: US 8,183,700 B2
(45) Date of Patent: May 22, 2012

(54) SEMICONDUCTOR DEVICE HAVING ALIGNMENT MARK AND ITS MANUFACTURING METHOD

(75) Inventors: Mutsuo Nishikawa, Matsumoto (JP); Kazuhiko Ikoma, Iiyama (JP)

(73) Assignee: Fuji Electric Co., Ltd. (JP)

( * ) Notice: Subject to any disclaimer, the term of this patent is extended or adjusted under 35 U.S.C. 154(b) by 659 days.

(21) Appl. No.: 12/132,074

(22) Filed: Jun. 3, 2008

(65) Prior Publication Data

US 2009/0032979 A1 Feb. 5, 2009

(30) Foreign Application Priority Data

Jul. 31, 2007 (JP) .................... 2007-199394

(51) Int. Cl.
*H01L 23/544* (2006.01)

(52) U.S. Cl. .......... 257/797; 257/E23.179; 257/E21.536

(58) Field of Classification Search .......... 257/797, 257/E23.179, E21.536
See application file for complete search history.

(56) References Cited

U.S. PATENT DOCUMENTS

| | | | | |
|---|---|---|---|---|
| 5,528,372 A | * | 6/1996 | Kawashima | 356/401 |
| 6,320,242 B1 | * | 11/2001 | Takasu et al. | 257/529 |
| 2001/0050437 A1 | | 12/2001 | Saito | |

FOREIGN PATENT DOCUMENTS

| | | |
|---|---|---|
| JP | 7-147225 A | 6/1995 |
| JP | 11-135391 A | 5/1999 |
| JP | 2001-326241 A | 11/2001 |
| JP | 2001-358048 A | 12/2001 |
| JP | 2005-236187 A | 9/2005 |

OTHER PUBLICATIONS

Partial English translation of Notification of Reasons for Refusal issued in corresponding JP patent application No. 2007-199394 dated Sep. 27, 2011. The original Japanese language document was submitted with the IDS dated Oct. 6, 2011.

Office Action issued in corresponding JP patent application No. 2007-199394 dated Sep. 27, 2011. Partial English translation to follow.

* cited by examiner

*Primary Examiner* — Benjamin Sandvik
*Assistant Examiner* — Krista Soderholm
(74) *Attorney, Agent, or Firm* — Rossi, Kimms & McDowell LLP

(57) ABSTRACT

Many holes are formed in an interlayer insulating film and the surface of the interlayer insulating film is covered with a metal film, with its surface undulated by openings or recesses formed to scatter reflection light. The size of the recesses is about the size of contact holes of elements. Hence the recesses are not detectable by an image recognition apparatus. The size of the metal film, however, is set so that it can be detected by the image recognition apparatus.

20 Claims, 8 Drawing Sheets

SEMICONDUCTOR DEVICE HAVING ALIGNMENT MARK AND ITS MANUFACTURING METHOD

BACKGROUND

Conventionally, active elements and passive elements are formed on the substrate of a semiconductor device. The active elements include transistors, diodes, etc., and the passive elements include resistors, capacitors, etc. In general, in addition to these elements, alignment markers are formed on the substrate of the semiconductor device. The alignment markers are used as patterns for position recognition for enabling automatic registration between a photomask and a wafer in manufacturing elements in wafer processes. The alignment markers are also used as patterns for automatic recognition of a chip position and coordinates on a chip in assembling processes, such as a semiconductor chip die bonding process and a wire bonding process.

In general, in wafer processes, alignment markers are recognized by an image recognition apparatus having a lens with a magnification factor 100 to 400. In contrast, in assembling processes, an image recognition apparatus has a lens with a magnification factor only 10 to 100, which is smaller than the magnification factor employed in the wafer processes. The reason is as follows.

As the lens magnification increases, the resolution becomes higher and the amount of image data to be processed increases, increasing the time taken by each alignment operation. Whereas in wafer processes, only one alignment operation needs to be performed for each process involving photo-exposure, in assembling processes alignment operations need to be performed a number of times that is equal to the number of semiconductor chips. The number of times of alignment operations thus can become very large in assembling processes. Therefore, in alignment processes, the time taken by each alignment operation can to shortened by decreasing the lens magnification.

It is therefore considered that in assembling processes, an appropriate approach to increasing the alignment marker recognition accuracy is to employ alignment markers whose pattern can be recognized easily. Japanese Patent No. 2,590,711, for example, discloses undulating a metal film by forming contact holes under the metal film. This method facilitates the recognition by laser light and enables patterning of a photoresist film even if the metal film has been flattened by CMP (chemical-mechanical polishing) during the manufacturing process.

JP-A-2005-236187, for example, discloses undulating a metal film by forming contact holes in an insulating film located between an active layer and a metal layer. This method enables patterning by using the undulation of the metal film as an alignment marker even when the insulating film is formed on a substrate by a liquid phase method.

JP-A-11-135391 and JP-A-2001-326241, for example, disclose forming one or more alignment markers from a group consisting of numerals, characters, symbols, and figures by undulating one or both of a wiring layer and an insulating film in bonding pad regions. This method can increase the recognition accuracy of alignment markers and enable space saving by having certain regions shared by the bonding pads and the alignment markers. When the bonding pads are undulated, however, the contact areas between wires and the pads can be decreased, causing some difficulty in bonding the wires to the pad. Furthermore, the strength of bonding between the pads and the wires can become insufficient.

A description will now be made in a case where bonding pads and alignment markers are provided separately in the technique of the above reference JP-A-11-135391. FIG. 12 is a plan view of an alignment marker of a conventional semiconductor device. As shown in FIG. 12, the alignment marker assumes a "+" shape, for example. A metal film 105 having the "+" shape is given a "+"-shaped projection by an underlying polysilicon film 103.

FIG. 13 is a sectional view showing a sectional structure along line 13-13 of FIG. 12. As shown in FIG. 13, the alignment marker of the conventional semiconductor device is formed using a semiconductor substrate 101, such as a silicon substrate. An $SiO_2$ layer 102 is formed on the surface of the semiconductor substrate 101. The polysilicon film 103 having a "+" shape, for example, in a plan view (see FIG. 12) is formed on part of the surface of the $SiO_2$ layer 102. An interlayer insulating film 104 is formed on the surfaces of the $SiO_2$ layer 102 and the polysilicon film 103. A metal film 105 made of aluminum, for example, and having a "+" shape, for example, in a plan view (see FIG. 12) is formed on part of the surface of the interlayer insulating film 104. To prevent metal corrosion due to moisture etc., a passivation film 106 is formed on the surfaces of the metal film 105 and the interlayer insulating film 104. The alignment marker of the semiconductor device shown in FIGS. 12 and 13 can increase the accuracy of its recognition and the reliability of the corrosion resistance without decreasing the strength of wire bonding.

Next, referring to FIGS. 14 and 15, a description will be made of how the alignment marker of FIGS. 12 and 13 behaves when it is illuminated with light. FIG. 14 is a sectional view showing reflection light from the alignment marker when the semiconductor device is not inclined. To recognize the alignment marker, an image recognition apparatus applies light to it. Light reflected by the metal film 105 of the alignment marker returns to the camera of the image recognition apparatus and is recognized as a pattern of the alignment marker by the image recognition apparatus.

In the conventional alignment marker, most of the surface of the metal film 105 is flat. The reflection angle of a reflection light beam from a flat region of the metal film 105 is the same as the incident angle of an incident light beam. On the other hand, for a light beam that is incident on a step region, produced by the polysilicon film 103, of the metal film 105, reflection light scattering occurs because the metal film 105 is curved there. That is, the alignment marker has regions where incident beams and reflection beams are directed regularly to prescribed directions and regions where scattering occurs due to the steps. The recognition accuracy of the alignment marker can be increased by discriminating between these different regions.

FIG. 15 is a sectional view showing reflection light from the alignment marker when the semiconductor device is inclined. As shown in FIG. 15, with the semiconductor device inclined, since most of the surface of the metal film 105 of the conventional alignment marker is flat, almost all incident beams and reflection beams are directed regularly to prescribed directions.

In each of the above-described techniques of Japanese Patent No. 2,590,711 and JP-A-2005-236187, however, steps are formed in a metal film by contact holes and these steps in the metal film are used as an alignment marker. In semiconductor devices, in general, the size of the contact hole is about 0.5 to 2.0 μm. On the other hand, as mentioned above, the magnification of the lens used in assembling processes is only about 10 to 100 so that the minimum size that can be recognized by using such a lens is one pixel, which is about 8 μm. This means that the contact holes are too small for an image recognition apparatus used in assembling processes. Hence an alignment marker that utilizes steps formed by contact holes cannot be recognized.

Furthermore, since contact holes are also formed in MOS transistors, resistors, etc., a large number of contact holes are dispersed over almost the entire surface of a semiconductor device. In an image recognition apparatus having a lens whose magnification is about 10 to 100, should contact holes be recognized, contact holes that do not belong to an alignment marker can be recognized as belonging to the alignment marker. Therefore, it is not appropriate to use such contact holes to form an alignment marker for assembling processes.

Furthermore, where a semiconductor device is inclined, almost all light that is applied to an alignment marker is reflected to a direction in which the camera of the image recognition apparatus that is applying the light does not exist. This means that the alignment marker of the semiconductor positioned at an incline can look very different from the semiconductor device that is not inclined.

Where a passivation film is formed on the metal film, light is refracted by the passivation film. Both of incident light from an image recognition apparatus and reflection light from the metal film are refracted by the passivation film, and the manner of refraction varies depending on its thickness. Therefore, if a variation occurs in the thickness of the passivation film in a wafer process, the degree of refraction of each of incident light and reflection light varies from one position to another. This means that the alignment marker configuration appears with inconsistencies.

Accordingly, there remains a need for alignment markers that can be recognized accurately even if the semiconductor device is inclined or the thickness of a passivation film is varied. Moreover, there remains a need for alignment markers that can be recognized accurately while being easily discriminated from contact holes dispersed on circuits. The present invention addresses these needs.

SUMMARY OF THE INVENTION

The present invention relates to a semiconductor device and its manufacturing method and, more particularly, to alignment markers for position recognition in assembling processes such as wire bonding and die bonding.

One aspect of the present invention is a semiconductor device. The semiconductor device includes a semiconductor substrate and at least two alignment markers on the semiconductor substrate. Each of the alignment markers includes an interlayer insulating film with a plurality of holes on the semiconductor substrate, a metal film for position detection on the interlayer insulating film with a plurality of openings or recesses aligned with the holes, and a passivation film covering the metal film and the interlayer insulating film.

The recesses can be arranged over the entire surface of the metal film. Each hole is wider on the side close to the passivation film than on the side close to the semiconductor substrate. Each recess can be about the size of each of contact holes of elements formed on the semiconductor substrate. Each recess can be smaller than one pixel of an image recognition apparatus for detecting the alignment markers. Each alignment marker is larger than one pixel of an image recognition apparatus for detecting the alignment markers. The spacing between the recesses can be identical. The distance between edges of the metal film and the recesses closest to the edges of the metal film are equal to the spacing between the recesses. At least one of the alignment markers can be different in shape from the other alignment markers.

The semiconductor device can further include an insulating layer on a surface of the semiconductor substrate and a wiring layer between the insulating layer and the interlayer insulating film. The holes can reach the wiring layer and the metal film can be in contact with the wiring layer through the holes. The wiring layer can be a polysilicon layer.

Another aspect of the present invention is a method of manufacturing at least one alignment marker in the semiconductor device. The method can include an insulating film forming step of forming the interlayer insulating film on the semiconductor substrate, a first etching step of selectively etching, by isotropic etching, the interlayer insulating film formed by the insulating film forming step to form recesses, a second etching step of forming holes by anisotropic etching in the recesses formed by the first etching step, a metal film forming step of forming the metal film for position detection on the interlayer insulating film with the holes formed by the second etching step, and a protective film forming step of forming the passivation film on surfaces of the interlayer insulating film and the metal film formed by the metal film forming step.

At least two alignment markers having different shapes can be formed in the semiconductor device.

DETAILED DESCRIPTION

Figure 1:
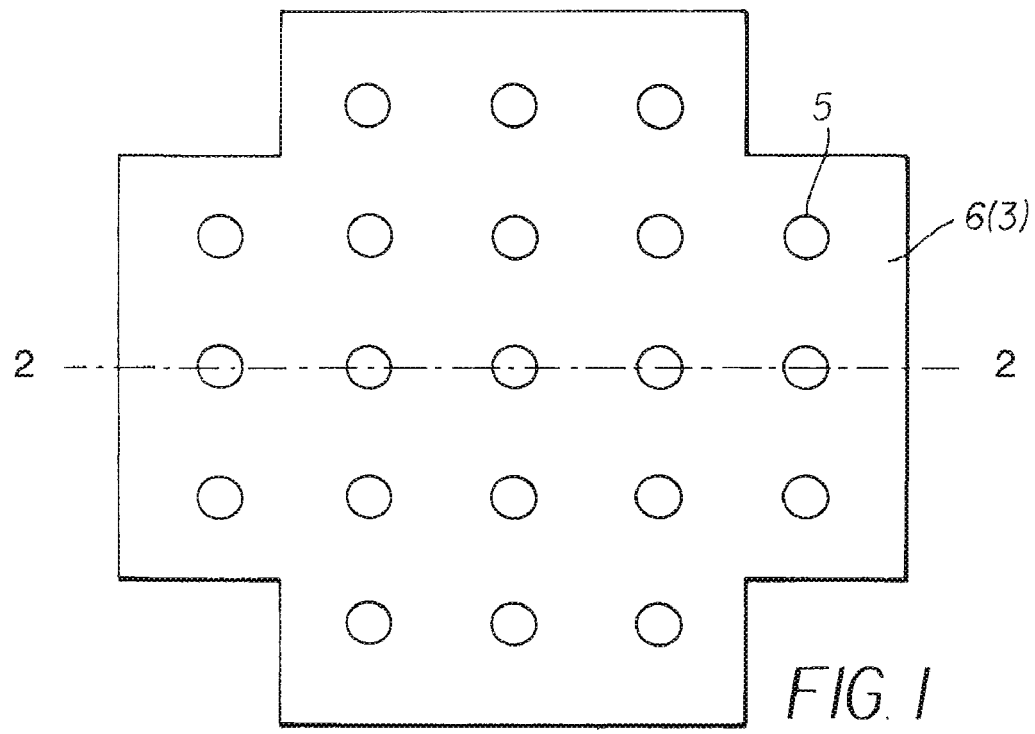
FIG. 1 is a plan view illustrating the structure of an alignment marker of a first embodiment of a semiconductor device according to the present invention.

Referring to FIG. 1, which illustrates the first embodiment, the alignment marker has openings or recesses 5 distributed over the entire surface of a metal film 6. A polysilicon film 3 having the same shape as the metal film 6 is formed under the metal film 6. The recesses 5 can be spaced equally. Moreover, the distance between the edges of the metal film 6 and the recesses 5 closest to the edges of the metal film 6 can be the same as the spacing between the recesses 5. Although in FIG. 1 the metal film 6 assumes a "+" shape in a plan view, its shape of the metal film 6 can have other configurations, and thus is not limited to it.

The size of each recess 5 is smaller than the size of one pixel of an image recognition apparatus. That is, the image recognition apparatus cannot recognize each recess 5. On the other hand, the metal film 6 is large enough to be recognized by the image recognition apparatus. More specifically, whereas the highest resolution of an image recognition apparatus used in assembling processes is 8 μm, for example, the diameter of the recesses 5 is roughly about the size of ordinary contact holes formed in elements, namely about 1.2 μm, for example. The distance or spacing between the recesses 5 can be set at about 1.2 μm or longer, for example, taking into consideration horizontal expansion due to round etching for forming the recesses 5. The width of the polysilicon film 3 can be about 50 to 200 μm, for example. Therefore, about 20 to 100 recesses 5 can be arranged along the width (along line 2-2 of FIG. 1). Hundreds to thousands of recesses 5 can be arranged in the entire surface.

Figure 2:
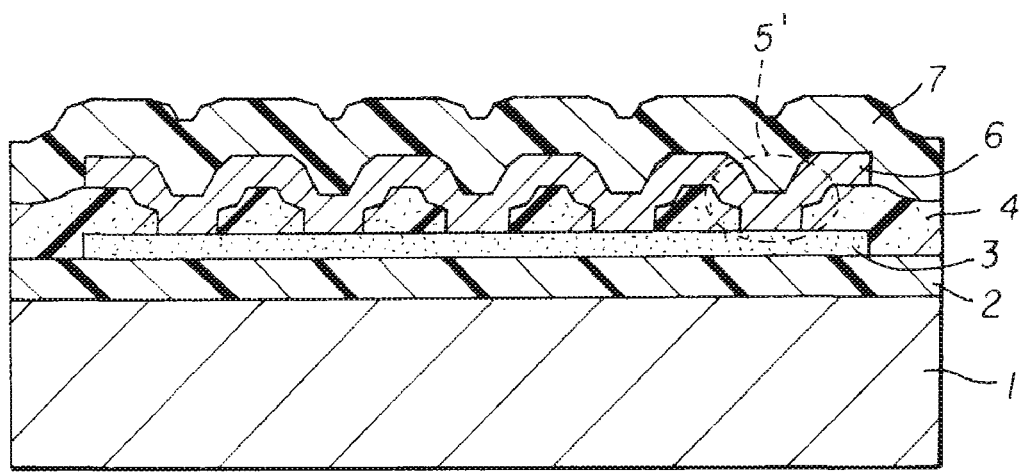
FIG. 2 is a sectional view illustrating a sectional structure taken along line 2-2 of FIG. 1.
Figure 3:
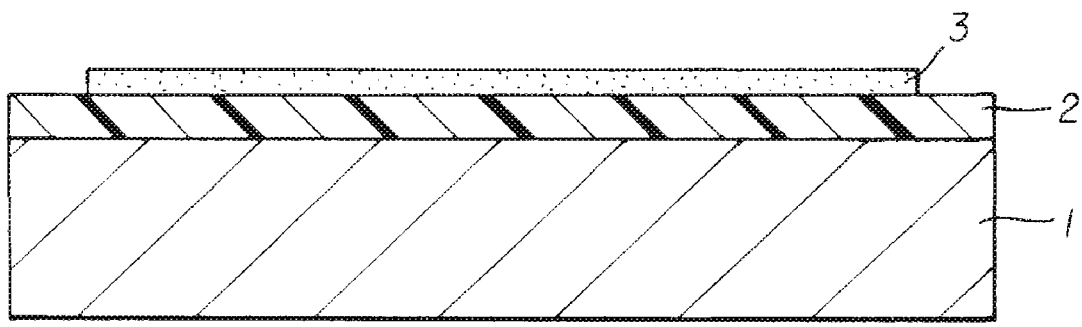
FIGS. 3-8 are sectional views illustrating the manufacturing process of the first embodiment.

Referring to FIG. 2, the alignment marker of the semiconductor device according to the first embodiment can be formed using a semiconductor substrate 1. An $SiO_2$ layer 2 is formed on the surface of the semiconductor substrate 1. The polysilicon film 3 having a "+" shape, for example, in a plan view (see FIG. 1) is formed on part of the surface of the $SiO_2$ layer 2. The polysilicon film 3 can be a wiring layer. For example, the polysilicon film 3 can be used as gate electrodes (in a region of the semiconductor device that is not illustrated in FIG. 2).

An interlayer insulating film 4 is formed on the surfaces of the $SiO_2$ layer 2 and the polysilicon film 3. Holes 5' reaching the polysilicon film 3 are formed by selectively removing the interlayer insulating film 4. The metal film 6 is formed on the surface of the interlayer insulating film 4 with the holes. Therefore, the metal film 6 following the contour of the interlayer insulating film 4 forms recesses and projections. Along the cross section, the opening of each hole is wider on the side opposite to the polysilicon film 3 than on the side close to the polysilicon film 3. Furthermore, the opening of each hole is curved to become wider as it move farther away from the polysilicon film 3. Since the holes have the above shape, the metal film 6 formed thereon is configured to scatter light applied from an image recognition apparatus. The metal film 6 can be made of aluminum, for example. The metal film 6 is formed in contact with the surface of the polysilicon film 3 through the holes. The recesses 5 thus can function as contact holes. A passivation film 7 is formed on the surfaces of the metal film 6 and the interlayer insulating film 4. The passivation film 7 allows the alignment marker to be discriminated from bonding pads.

In the first embodiment, an image recognition apparatus cannot recognize each recess 5. Since each recess 5 scatters light when it is reflected, a large number of recesses 5 can be arranged in the metal film 6 to form a desired pattern. The light scattering portions are concentrated in the metal film 6. Furthermore, the total area of light scattering portions is increased. As a result, the image recognition apparatus can recognize the pattern that emits scatted light in a concentrated manner. Setting the pattern of the recesses 5 larger than the highest resolution of the image recognition apparatus allows the alignment marker to exercise its original function. At least two or more such alignment markers can be provided in the semiconductor device, which makes it possible to judge its relative position.

Since the recesses 5 and contact holes of elements are smaller than the highest resolution of the image recognition apparatus, the image recognition apparatus cannot recognize each of the contact holes of the elements. Therefore, the alignment markers can be clearly discriminated from the contact holes of the elements so that the contact holes of elements cannot be erroneously recognized as an alignment marker.

Figure 4:
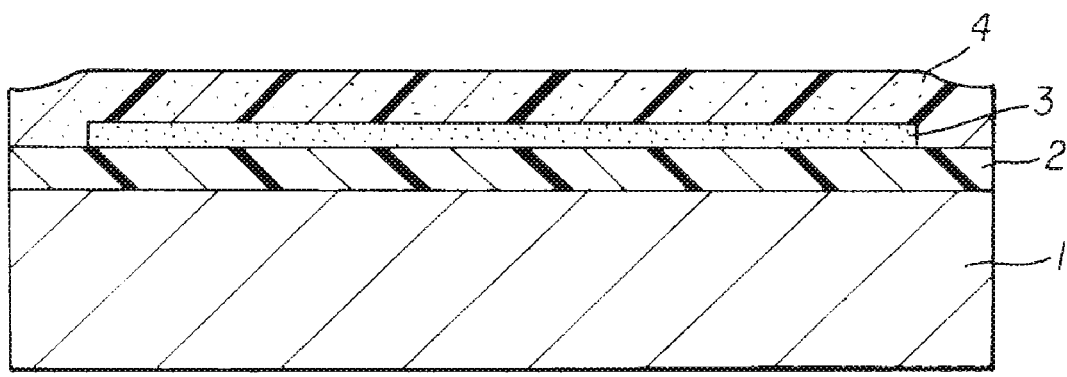
Figure 5:
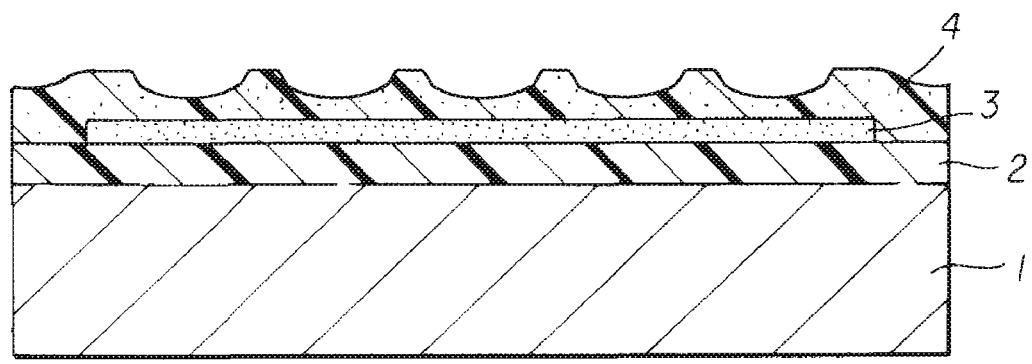
Figure 6:
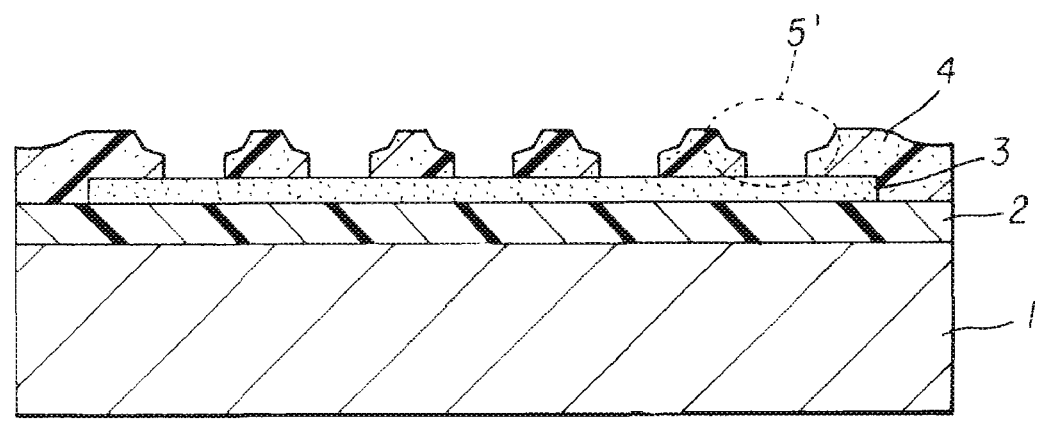

Referring to FIGS. 3-8, the manufacturing method of the alignment marker of the semiconductor device according to the first embodiment will be described. An $SiO_2$ layer 2 is formed on the surface of a semiconductor substrate 1, which can be a silicon substrate, for example. A polysilicon film 3 is formed on the surface of the $SiO_2$ layer 2. Then, the polysilicon film 3 is patterned to have a "+" shape, for example, in plan view by photolithography and etching. Then, as shown in FIG. 4, an interlayer insulating film 4 is deposited on the entire exposed surfaces of the $SiO_2$ layer 2 and the polysilicon film 3. Then, as shown in FIG. 5, shallow portions of the interlayer insulating film 4 are removed selectively by isotropic etching called round etching. Portions of the interlayer insulating film 4 that are arranged at regular intervals can be removed selectively. Then, as shown in FIG. 6, central portions of the respective shallow recesses of the interlayer insulating film 4 (see FIG. 5) are etched away by anisotropic etching called contact etching until the polysilicon film 3 is reached. As a result, holes 5' are formed in the interlayer insulating film 4 in such a manner that the opening of each hole 5' (along the cross section) is wider on the side opposite (i.e., side closer to the passivation film 7) to the semiconductor substrate 1 than on the side close to the semiconductor substrate 1.

Figure 7:
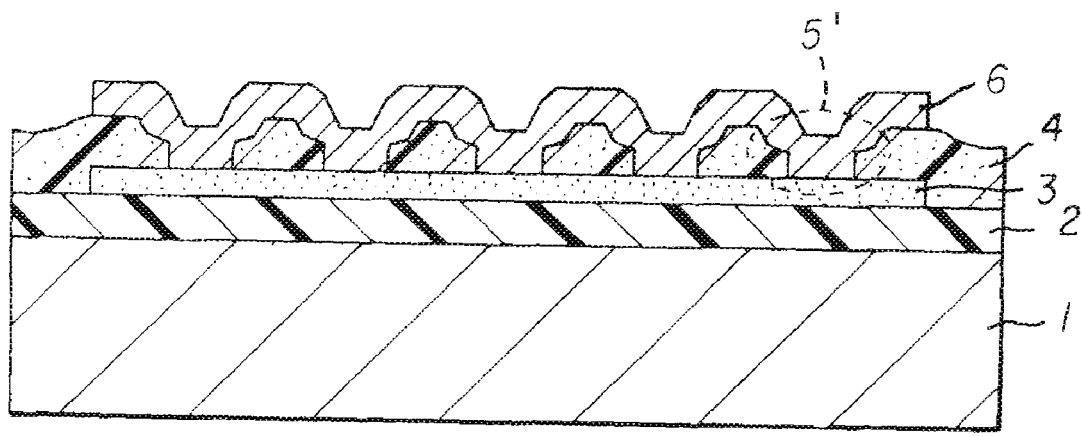
Figure 8:
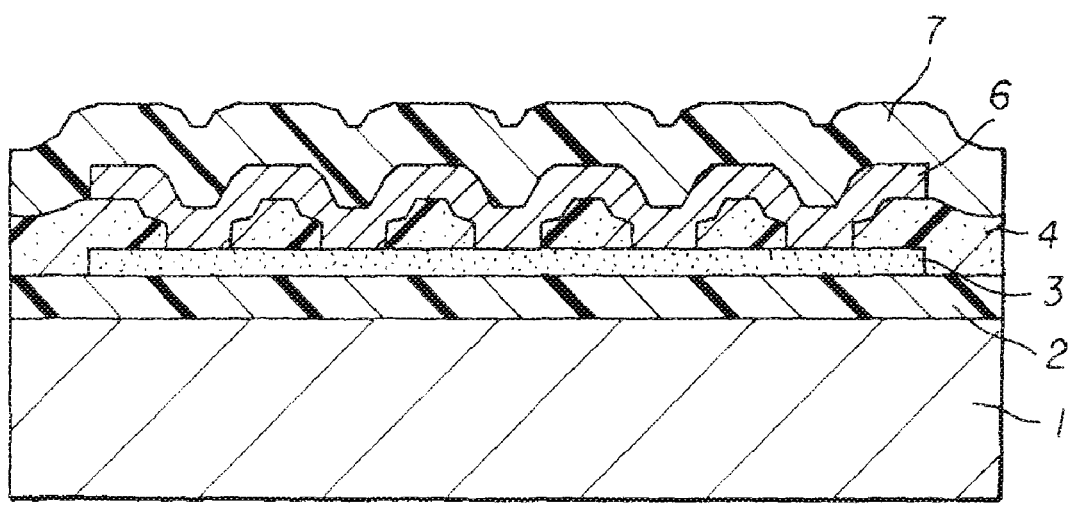

Then, as shown in FIG. 7, a metal film 6 is formed on the surface of the interlayer insulating film 4 formed with the holes 5' (see FIG. 6). Then, the metal film 6 is patterned into the same plan-view shape as the polysilicon film 3 by photolithography and etching. Since the interlayer insulating film 4 is formed with the holes 5', the metal film 6 is given recesses and projections that are arranged continuously over the entire surface. Then, as shown in FIG. 8, a passivation film 7 is formed on the entire exposed surfaces of the interlayer insulating film 4 and the metal film 6.

The $SiO_2$ layer 2, the polysilicon film 3, the interlayer insulating film 4, the metal film 6, and the passivation film 7 can be formed using layers that are formed in manufacturing MOS transistors. More specifically, the $SiO_2$ layer 2, for example, can be formed using a LOCOS layer used in manufacturing MOS transistors. The polysilicon film 3 can be formed using a polysilicon film used for forming the gate electrodes of the MOS transistors. The interlayer insulating film 4 can be formed using an $SiO_2$ film commonly called an HTO film, a BPSG film, or a TEOS film. The metal film 6 can be formed by using an aluminum film used for forming interconnections or the like in manufacturing the MOS transistors. Likewise, the passivation film 7 can be formed by using a passivation film itself used in manufacturing the MOS transistors. The passivation film 7 used in this embodiment can be a lamination film of a silicon oxide film and a silicon nitride film. The holes 5' can be formed at the same time as contact holes to be used for connecting metal gate electrodes to polysilicon gate electrodes. Therefore, the semiconductor device according to the first embodiment can be formed easily with a process for manufacturing MOS transistors.

In each alignment marker of the semiconductor device according to the first embodiment, the $SiO_2$ layer 2 and the polysilicon layer 3 need not be provided. In such a case, the interlayer insulating film 4 is formed on the surface of the semiconductor substrate 1. The holes 5' can be formed in the interlayer insulating film 4 without reaching the semiconductor substrate 1. This prevents the semiconductor substrate 1 from receiving potential-related influence and can thereby secure the reliability. Therefore, other elements such as diffusion resistors can be formed in the region concerned of the semiconductor substrate 1.

Figure 9:
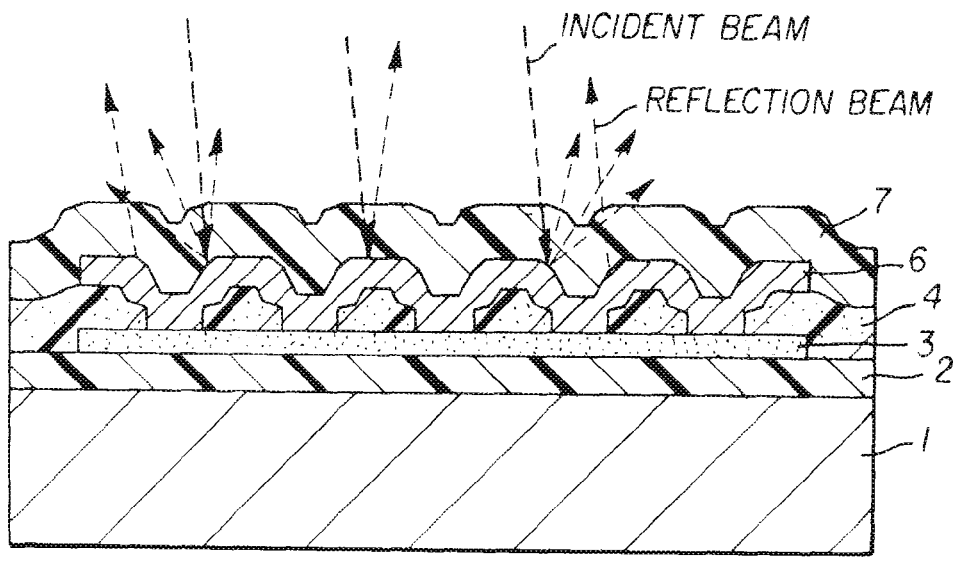
FIG. 9 is a sectional view illustrating reflection light from the alignment marker when the semiconductor device according to the first embodiment is positioned at level (i.e., not inclined).
Figure 10:
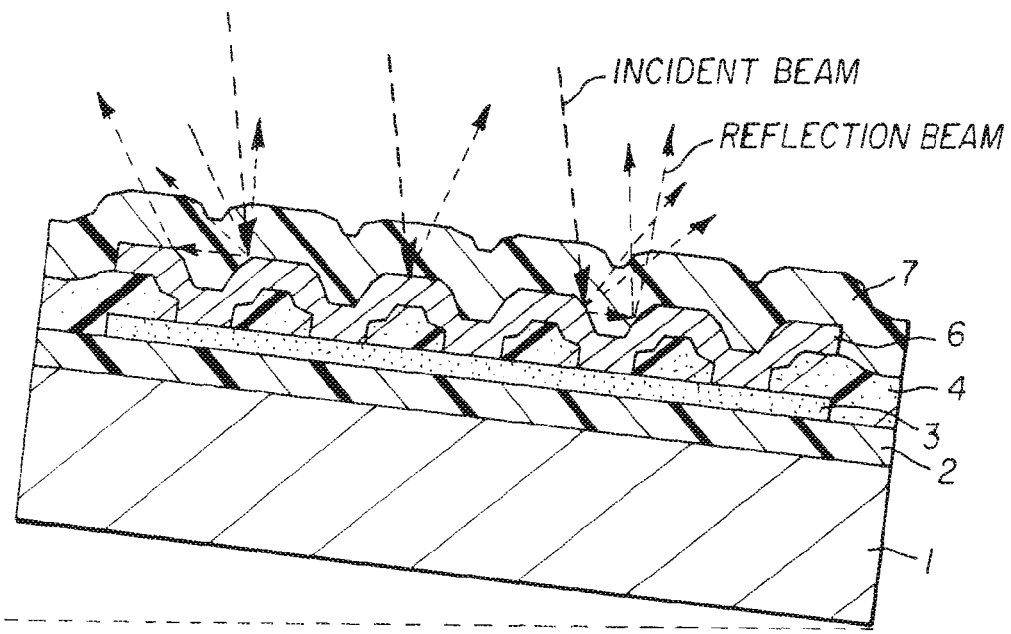
FIG. 10 is a sectional view illustrating reflection light from the alignment marker when the semiconductor device according to the first embodiment is inclined.

Referring to FIGS. 9 and 10, a description will be made of how the alignment marker of the semiconductor device according to the first embodiment behaves when it is illuminated with light. FIG. 9 is a sectional view showing reflection light from the alignment marker when the semiconductor device is not inclined (i.e., at level). As shown in FIG. 9, when light is applied to the semiconductor device from an image recognition apparatus, reflection light scattering occurs in each recess 5 of the metal film 6. Since the recesses 5 are formed over the entire surface of the metal film 6, reflection light scatters over the entire surface of the metal film 6. That is, reflection light scatters uniformly over the entire surface of the metal film 6.

FIG. 10 is a sectional view showing reflection light from the alignment marker when the semiconductor device is inclined. As shown in FIG. 10, since reflection light scatters in each recess 5 of the metal film 6, scattered light can be directed to the camera of the image recognition apparatus consistently. Therefore, according to the first embodiment, even if the semiconductor device is inclined in an assembling process, the alignment markers can be recognized in the same manner as in the case where the semiconductor device is not inclined. The recognition accuracy of the alignment markers can thus be increased.

Also in the alignment marker of the semiconductor device according to the first embodiment, the passivation film 7 refracts light. Since as shown in FIG. 9, reflection light scatters even when the semiconductor device is not inclined, there is almost no effect even if the degree of light refraction is varied due to a variation in the thickness of the passivation film 7 because the light is scattered. Therefore, according to the first embodiment, the thickness variation of the passivation film 7 has insubstantial effect. The recognition accuracy of the alignment markers can thus be increased.

Figure 11:
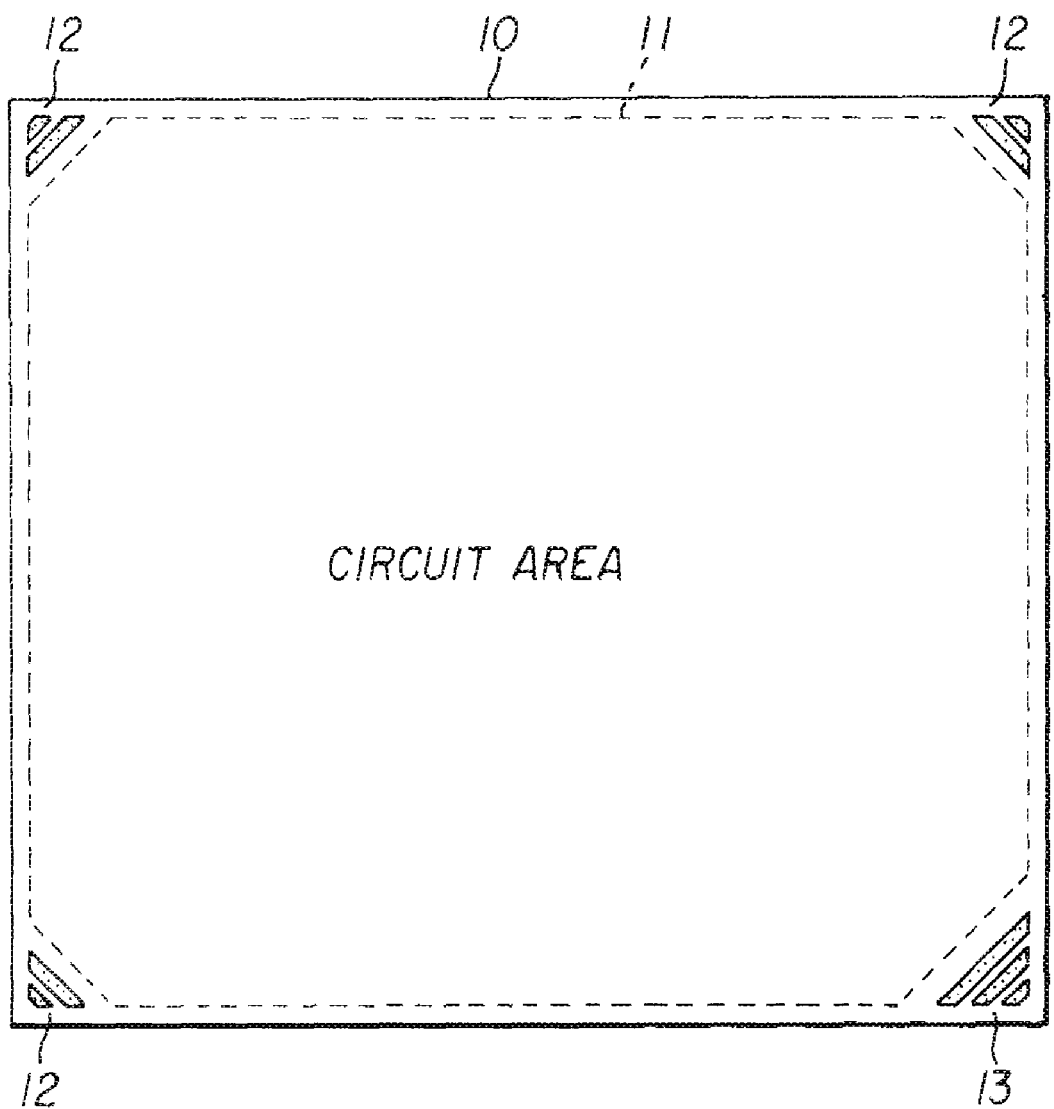
FIG. 11 is a plan view illustrating alignment markers of a second embodiment of the semiconductor device according to the present invention.
Figure 12:
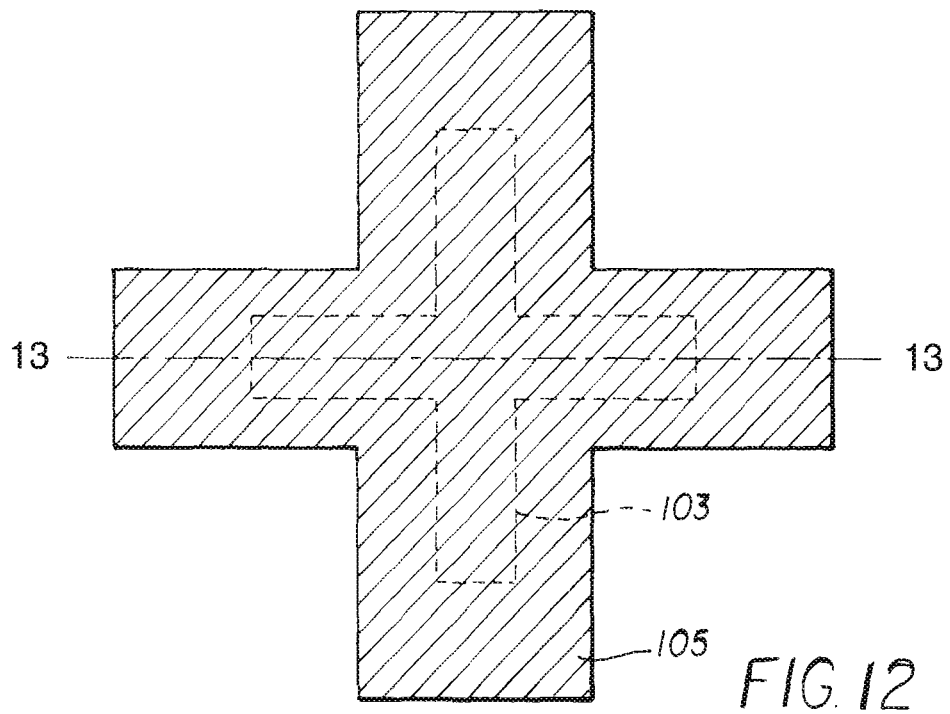
FIG. 12 is a plan view of an alignment marker of a conventional semiconductor device.
Figure 13:
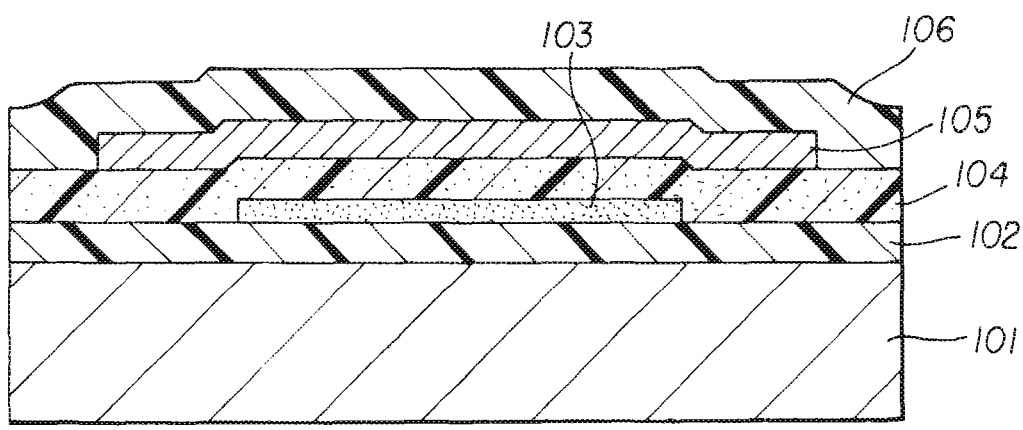
FIG. 13 is a sectional view illustrating a sectional structure taken along line 13-13 of FIG. 12.
Figure 14:
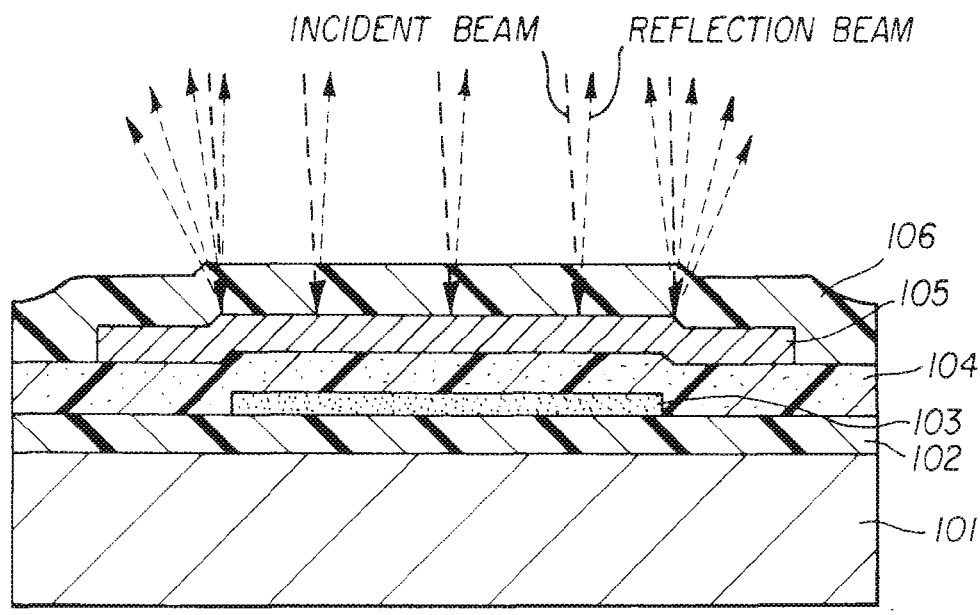
FIG. 14 is a sectional view illustrating reflection light from the alignment marker when the conventional semiconductor device is positioned at level (i.e., not inclined).
Figure 15:
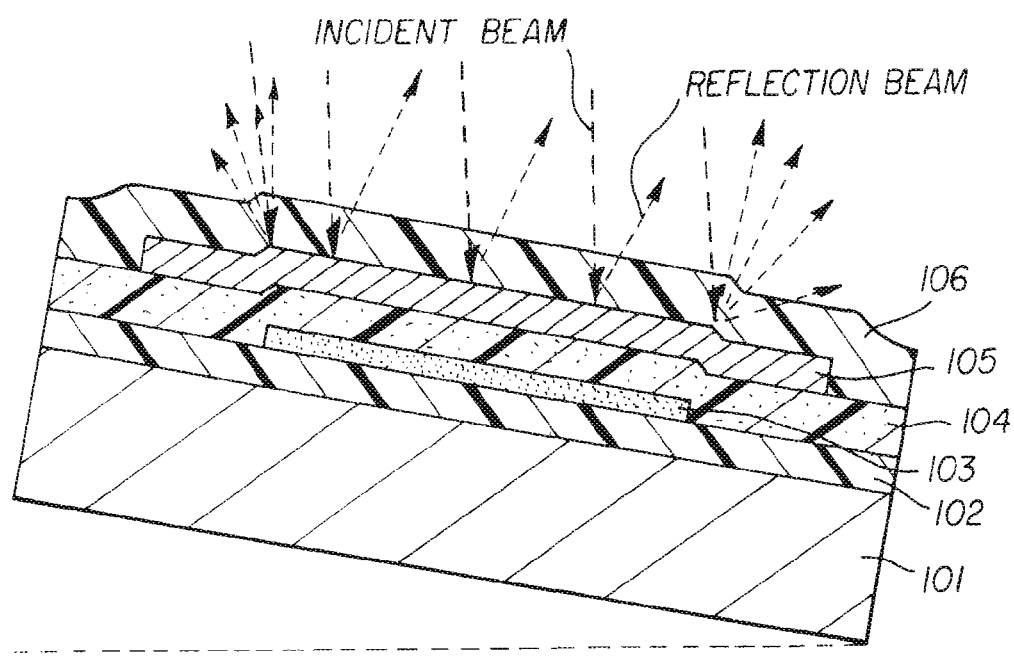
FIG. 15 is a sectional view illustrating reflection light from the alignment marker when the conventional semiconductor device is inclined.

Referring to FIG. 11, the second embodiment can be formed the same as the first embodiment except for the configuration of the alignment markers. In the second embodiment, the plan-view shape of each divisional component of each alignment marker is trapezoidal. Specifically, a first pattern 12, similar to a double line, each having a trapezoidal shape can be arranged at three of the four corners of a semiconductor substrate 10 that are located outside the circuit area 11 and a second pattern 13, similar to a triple line, each also having a trapezoidal shape can be arranged at the other corner.

Although in the second embodiment the alignment markers are formed at the four corners of the semiconductor substrate 10, it is not limited thereto. For example, the alignment markers can be provided with the second pattern 13 formed at one of the four corners and the first pattern 12 formed at least one of the other three corners. Although in the second embodiment, the plan-view shape of each divisional component of each of the first pattern 12 and the second pattern 13 is trapezoidal, the pattern is not limited to this configuration. That is, the plan-view shape of the divisional components of the first pattern 12 can be different from that of the second pattern 13.

According to the second embodiment, since the alignment markers are provided at the outermost positions of the semiconductor substrate 10, a displacement of the chip in the θ direction (i.e., an in-plane rotational displacement) can be recognized most accurately. Since the alignment markers have the different patterns, when, for example, the chip is rotated by 90°, 180°, or 270° from its regular orientation, such erroneous orientation can be detected. The second embodiment is thus very effective in reducing the defect rate and increasing the defect detection sensitivity in assembling processes. In general, the four corners of a semiconductor substrate are excluded from a circuit area because defects tend to occur there. Therefore, the alignment markers can be provided without narrowing or occupying the circuit area 11.

The present technique calls for forming a plurality of recesses in the metal film to scatter light incident on the metal film. Therefore, the image recognition apparatus can recognize, even if the semiconductor device is positioned at an inclination, a pattern equivalent to a pattern recognized in the state where the semiconductor device is positioned at level. Furthermore, even if, for example, the manner of light refraction is varied by the thickness variation of the passivation film, it does not influence the recognition result of the image recognition apparatus. The recognition accuracy of the alignment markers can thus be increased.

The present technique can increase the recognition accuracy of the alignment markers by undulating the metal film to scatter light. The recesses and the contact holes of the elements can be made smaller than the minimum size recognized by the image recognition apparatus. Each alignment marker can be larger than the minimum size recognized by the image recognition apparatus. Therefore, the alignment markers clearly can be discriminated from the contact holes of the elements, increasing the recognition accuracy of the alignment markers.

By having different alignment marker configuration, it possible to judge the relative position. The present technique provides advantages in that the alignment markers can be recognized accurately even if the semiconductor device is inclined or the thickness of the passivation film is varied, and that the alignment markers can be recognized accurately and discriminated clearly from contact holes dispersed on circuits.

The present semiconductor device is useful in manufacturing semiconductor devices for vehicles, industrial uses, medical purposes, etc., and is particularly suitable for assembling processes such as wire bonding and die bonding.

While the present invention has been particularly shown and described with reference to preferred embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2007-199394 filed on 31 Jul. 2007. The disclosure of the priority application in its entirety, including the drawings, claims, and the specification thereof, is incorporated herein by reference.

What is claimed is:
1. A semiconductor device comprising:
a semiconductor substrate;
at least two alignment markers on the semiconductor substrate,
wherein each of the alignment markers comprises:
an interlayer insulating film with a plurality of holes on the semiconductor substrate;
a metal film for position detection on the interlayer insulating film with a plurality of recesses aligned with the holes; and a passivation film covering the metal film and the interlayer insulating film wherein each of the recesses is smaller than one pixel of an image recognition apparatus for detecting the alignment markers.

2. The semiconductor device according to claim 1, wherein the recesses are arranged over the entire surface of the metal film.

3. A semiconductor device comprising:
a semiconductor substrate;
at least two alignment markers on the semiconductor substrate,
wherein each of the alignment markers comprises:
an interlayer insulating film with a plurality of holes on the semiconductor substrate;
a metal film for position detection on the interlayer insulating film with a plurality of recesses aligned with the holes; and
a passivation film covering the metal film and the interlayer insulating film,
wherein each of the holes is wider on the side close to the passivation film than on the side close to the semiconductor substrate.

4. The semiconductor device according to claim 1, wherein each of the recesses is about the size of each of contact holes of elements formed on the semiconductor substrate.

5. The semiconductor device according to claim 3, wherein each of the recesses is smaller than one pixel of an image recognition apparatus for detecting the alignment markers.

6. A semiconductor device comprising:
a semiconductor substrate;
at least two alignment markers on the semiconductor substrate,
wherein each of the alignment markers comprises:
an interlayer insulating film with a plurality of holes on the semiconductor substrate;
a metal film for position detection on the interlayer insulating film with a plurality of recesses aligned with the holes; and
a passivation film covering the metal film and the interlayer insulating film,
wherein each of the alignment markers is larger than one pixel of an image recognition apparatus for detecting the alignment markers.

7. The semiconductor device according to claim 1, wherein the spacing between the recesses are identical.

8. A semiconductor device comprising:
a semiconductor substrate;
at least two alignment markers on the semiconductor substrate,
wherein each of the alignment markers comprises:
an interlayer insulating film with a plurality of holes on the semiconductor substrate;
a metal film for position detection on the interlayer insulating film with a plurality of recesses aligned with the holes; and
a passivation film covering the metal film and the interlayer insulating film,
wherein the distance between edges of the metal film and the recesses closest to the edges of the metal film is equal to the spacing between the recesses.

9. The semiconductor device according to claim 1, wherein at least one of the alignment markers is different in shape from another of the alignment markers.

10. A semiconductor device comprising:
a semiconductor substrate;
at least two alignment markers on the semiconductor substrate,
wherein each of the alignment markers comprises:
an interlayer insulating film with a plurality of holes on the semiconductor substrate;
a metal film for position detection on the interlayer insulating film with a plurality of recesses aligned with the holes; and
a passivation film covering the metal film and the interlayer insulating film,
further comprising:
an insulating layer on the semiconductor substrate; and
a wiring layer between the insulating layer and the interlayer insulating film,
wherein the holes reach the wiring layer and the metal film is in contact with the wiring layer through the holes.

11. The semiconductor device according to claim 10, wherein the wiring layer is a polysilicon layer.

12. A method of manufacturing at least one alignment marker in a semiconductor device, comprising an insulating film forming step of forming an interlayer insulating film on a semiconductor substrate; a first etching step of selectively etching, by isotropic etching, the interlayer insulating film formed by the insulating film forming step to form recesses; a second etching step of forming holes by anisotropic etching in the recesses formed by the first etching step; a metal film forming step of forming a metal film for position detection on the interlayer insulating film with the holes formed by the second etching step; and a protective film forming step of forming a passivation film and covering the metal film and the interlayer insulating film with the passivation film wherein each of the recesses is smaller than one pixel of an image recognition apparatus for detecting the at least one alignment marker.

13. The method according to claim 12, wherein the recesses are formed over the entire surface of the metal film.

14. The method according to claim 12, wherein each of the holes is wider on the side close to the passivation film than on the side close to the semiconductor substrate.

15. The method according to claim 12, wherein each of the recesses is about the size of each of contact holes of elements formed on the semiconductor substrate 16. The method according to claim 15, wherein each of the recesses is smaller than one pixel of an image recognition apparatus for detecting the alignment marker.

17. The method according to claim 12, wherein the alignment marker is larger than one pixel of an image recognition apparatus for detecting the alignment marker.

18. The method according to claim 13, wherein the spacing between the recesses are identical.

19. The method according to claim 14, wherein at least two alignment markers having different shapes are formed in the semiconductor device.

20. The method according to claim 12, further comprising the steps of: forming an insulating layer on the semiconductor substrate; and forming a wiring layer between the insulating layer and the interlayer insulating film, wherein the holes reach the wiring layer and the metal film is in contact with the wiring layer through the holes.

\* \* \* \* \*